(12) United States Patent
Takagi et al.

(10) Patent No.: US 10,283,489 B2
(45) Date of Patent: May 7, 2019

(54) LIGHT EMITTING DEVICE

(71) Applicant: NICHIA CORPORATION, Anan-shi, Tokushima (JP)

(72) Inventors: Yasuhiko Takagi, Anan (JP); Tetsuya Yagi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/974,251

(22) Filed: Dec. 18, 2015

(65) Prior Publication Data

US 2016/0190106 A1    Jun. 30, 2016

(30) Foreign Application Priority Data

Dec. 26, 2014 (JP) ................... 2014-264717

(51) Int. Cl.
*H01L 25/075* (2006.01)
*H01L 33/62* (2010.01)
(Continued)

(52) U.S. Cl.
CPC .......... *H01L 25/0753* (2013.01); *H01L 24/48* (2013.01); *H01L 24/49* (2013.01);
(Continued)

(58) Field of Classification Search
CPC ... H01L 25/0753; H01L 33/62; H01L 33/486; H01L 23/495–49596
See application file for complete search history.

(56) References Cited

U.S. PATENT DOCUMENTS

2002/0001192 A1\* 1/2002 Suehiro ................ G02B 6/0068
362/240
2007/0063647 A1\* 3/2007 Yu ........................ H01L 25/0753
313/512
(Continued)

FOREIGN PATENT DOCUMENTS

JP    2000-022221 A    1/2000
JP    2003-017753 A    1/2003
(Continued)

*Primary Examiner* — Lauren R Bell
(74) *Attorney, Agent, or Firm* — Global IP Counselors, LLP

(57) ABSTRACT

A light emitting device, includes: three light emitting elements with different emission colors; and a package including a plurality of lead frames to individually drive the three light emitting elements, and a resin molding formed integrally with the plurality of lead frames and including an opening in a surface of the resin molding to house the light emitting elements, a portion of each of the plurality of lead frames being exposed on a bottom surface of the opening, and another portion of each of the plurality of lead frames being exposed on an outer surface of the resin molding, the three light emitting elements being disposed on one of the lead frames exposed on the bottom surface of the opening and arranged so as to form an isosceles triangle with a bottom angle of 30 to 60 degrees, and a distance between two of the light emitting elements located on a base of the isosceles triangle is one to two times a length of a side of the light emitting element located at an apex of the isosceles triangle.

18 Claims, 4 Drawing Sheets

(51) Int. Cl.
*H01L 23/00* (2006.01)
*H01L 33/48* (2010.01)
*H01L 33/60* (2010.01)

(52) U.S. Cl.
CPC ............ *H01L 33/62* (2013.01); *H01L 33/486* (2013.01); *H01L 33/60* (2013.01); *H01L 2224/48091* (2013.01); *H01L 2224/48247* (2013.01); *H01L 2224/48465* (2013.01); *H01L 2224/4912* (2013.01); *H01L 2224/49113* (2013.01); *H01L 2924/0002* (2013.01)

(56) References Cited

U.S. PATENT DOCUMENTS

| | | | |
|---|---|---|---|
| 2007/0247841 A1 | 10/2007 | Kono et al. | |
| 2008/0170391 A1* | 7/2008 | Norfidathul | H01L 25/0753 362/227 |
| 2009/0230413 A1 | 9/2009 | Kobayakawa et al. | |
| 2010/0207133 A1* | 8/2010 | Taguchi | H01L 25/0753 257/89 |
| 2010/0277919 A1 | 11/2010 | Okada et al. | |
| 2011/0211348 A1 | 9/2011 | Kim | |
| 2012/0032225 A1* | 2/2012 | Hamaguchi | H01L 33/44 257/99 |
| 2013/0020595 A1 | 1/2013 | Moriguchi et al. | |
| 2013/0027930 A1* | 1/2013 | Kobayakawa | H01L 25/0753 362/235 |
| 2013/0234175 A1 | 9/2013 | Okada et al. | |
| 2013/0341656 A1* | 12/2013 | Chan | H01L 33/486 257/88 |
| 2014/0103375 A1 | 4/2014 | Kobayakawa et al. | |
| 2014/0353697 A1 | 12/2014 | Okada et al. | |
| 2014/0367714 A1 | 12/2014 | Taguchi | |
| 2015/0091044 A1 | 4/2015 | Kobayakawa et al. | |
| 2015/0311184 A1 | 10/2015 | Kobayakawa et al. | |
| 2015/0311934 A1 | 10/2015 | Taguchi | |
| 2017/0092629 A1 | 3/2017 | Taguchi | |
| 2017/0170374 A1 | 6/2017 | Kobayakawa et al. | |
| 2017/0271310 A1 | 9/2017 | Moriguchi et al. | |

FOREIGN PATENT DOCUMENTS

| | | |
|---|---|---|
| JP | 2006-024794 A | 1/2006 |
| JP | 2007-311736 A | 11/2007 |
| JP | 2008-010562 A | 1/2008 |
| JP | 2009-021417 A | 1/2009 |
| JP | 2010-098276 A | 4/2010 |
| JP | 2011-216891 A | 10/2011 |
| JP | 2011-233671 A | 11/2011 |
| JP | 2013-026510 A | 2/2013 |
| WO | 2008099542 A1 | 8/2008 |
| WO | 2009011302 A1 | 1/2009 |

* cited by examiner

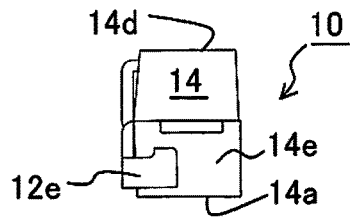
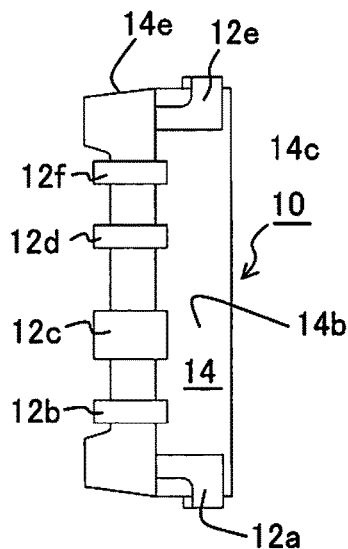
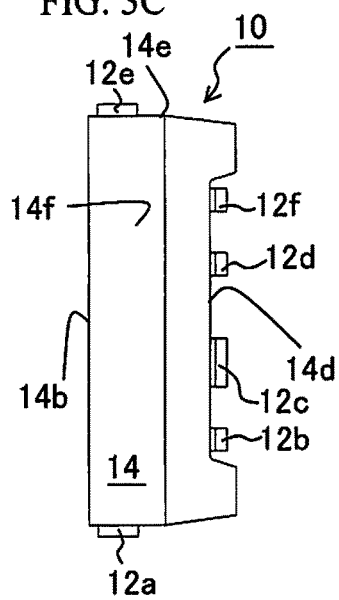
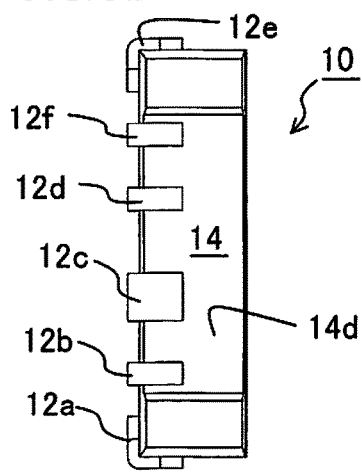

LIGHT EMITTING DEVICE

CROSS-REFERENCE TO RELATED APPLICATIONS

This application claims priority to Japanese Patent Application No. 2014-264717 filed on Dec. 26, 2014. The entire disclosure of Japanese Patent Application No. 2014-264717 is hereby incorporated herein by reference.

BACKGROUND

1. Field of the Invention

The present disclosure relates to a light emitting device.

2. Description of Related Art

Light emitting devices that are compact, have good sensitivity, and make use of light emitting elements with high brightness and output have been developed in recent years and put to use in a variety of fields. For instance, various light emitting devices known as a side-view type have been developed in which a plurality of light emitting elements are combined to provide a high level of brightness while also making the device more compact, more power efficient, more lightweight, and so on (JP2007-311736A, JP2008-10562A, for example).

In particular, some applications require a light emitting device with which high brightness can be obtained while also mixing a plurality of emission light colors.

SUMMARY

It is an object of the invention to provide a side emission (side view) type of light emitting device with which better color mixing can be achieved.

The light emitting device of the present disclosure includes three light emitting elements with different emission colors; and a package including a plurality of lead frames to individually drive the three light emitting elements, and a resin molding formed integrally with the plurality of lead frames and including an opening in a surface of the resin molding to house the light emitting elements, a portion of each of the plurality of lead frames being exposed on a bottom surface of the opening, and another portion of each of the plurality of lead frames being exposed on an outer surface of the resin molding, the three light emitting elements being disposed on one of the lead frames exposed on the bottom surface of the opening and arranged so as to form an isosceles triangle with a bottom angle of 30 to 60 degrees, and a distance between two of the light emitting elements located on a base of the isosceles triangle is one to two times a length of a side of the light emitting element located at an apex of the isosceles triangle.

According to the light emitting device of the present disclosure, it is possible to provide a side emission type of light emitting device with which better color mixing can be achieved.

BRIEF DESCRIPTION OF DRAWINGS

FIG. 3A is a schematic front view of the light emitting device in FIG. 1, FIG. 3B is a schematic bottom view, FIG. 3C is a schematic top view, FIG. 3D is a schematic side view, and FIG. 3E is a schematic rear view.

DETAILED DESCRIPTION

Figure 1:
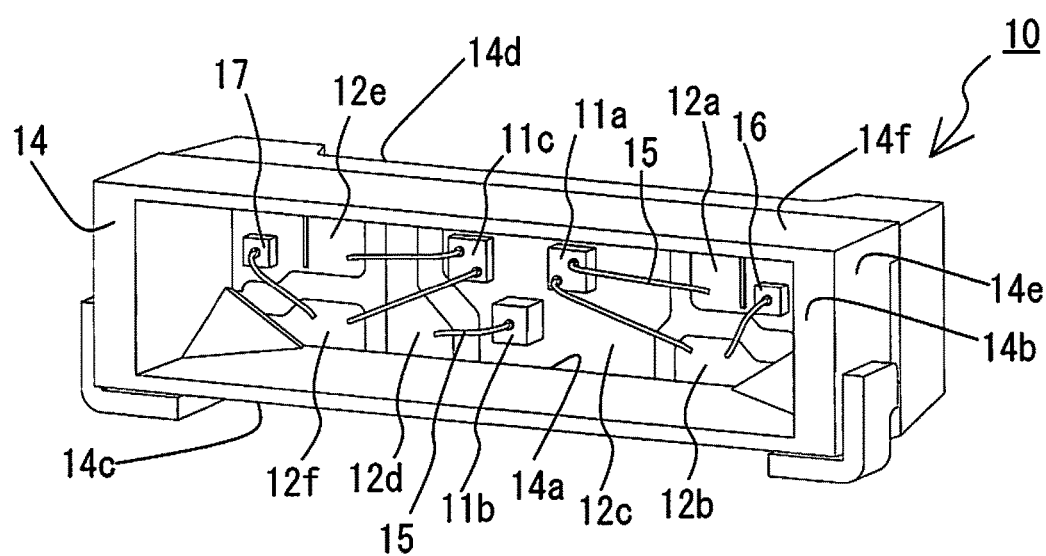
FIG. 1 is a schematic oblique view of an embodiment of a light emitting device according to one embodiment of the present invention.

Embodiments for implementing the light emitting device of the present invention will be described below with reference to the accompanying drawings. Embodiments of the light emitting device described below that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

In the present Specification, "plan view" refers to a view from the side where the light is extracted from the light emitting device. Also, "light emitting elements having different emission colors" refers to light emitting elements having peak wavelengths that differs from each other by at least 5 nm.

This light emitting device is mainly constituted by three light emitting elements and a package.

Light Emitting Elements

The light emitting elements can be any type that is commonly used in this field, such as a light emitting diode, a laser diode, or another such light emitting element. For example, a semiconductor stacked structure that includes an active layer can be formed from a variety of semiconductors, such as a nitride semiconductor ($In_XAl_YGa_{1-X-Y}N$, where $0 \leq X$, $0 < Y$, and $X+Y \leq 1$), GaP, GaAs, and other such as group III-V compound semiconductors, ZnSe, and group II-VI compound semiconductors.

In the light emitting elements, a light-transmissive substrate (such as a sapphire substrate) may be used as a substrate for growing the semiconductor layer. The substrate may be present in the light emitting elements that make up the light emitting device, or may be removed by laser lift-off or another such method.

Also, the light emitting elements may have a known stacked structure such as the stacked structures discussed in Japanese Laid-Open Patent Applications 2008-300719 and 2009-10280, which are so-called vertical dice or laminated dice.

It is preferable for three light emitting elements with different emission colors to be mounted in a single light emitting device. There are no particular restrictions on the emission colors of the three light emitting elements, but a combination of light emitting elements that emit red, blue, and green light is preferably used, because the resulting light emitting device will be a full-color light emitting device. One or more additional light emitting elements may be mounted in the light emitting device, but in this case it is preferable that three light emitting elements with different emission colors are preferably used as a unit, and a plurality of these units are mounted.

In the case where three light emitting elements with different emission colors are thus mounted so that they can each be driven individually, it will be possible for the brightness of each color to be adjusted individually, so that a plurality of emission colors can be combined to obtain the desired emission color.

If a plurality of light emitting elements of different emission colors are mounted too close together in a single light emitting device and one or more of the light emitting elements are lit to emit light of one color of the different emission colors, the emitted light will tend to be absorbed by the other light emitting elements. Accordingly, the light emitting elements are preferably disposed so as not to be too close together. On the other hand, in the case where light emitting elements of different emission colors are all lit at the same time to obtain mixed-color light, the light emitting elements are preferably spaced closely to some extent. In view of emitting single-color light and multi-color light using a plurality of light emitting elements of different emission colors, light emitting elements with square shape in plan view, for example, can be preferably arranged in a checkerboard pattern.

More specifically, in the case where three light emitting elements with different emission colors are mounted in a single light emitting device, the three elements are preferably disposed so as to form an isosceles triangle with a bottom angle of 30 to 60 degrees. In other words, the three points that make an isosceles triangle with a bottom angle of 30 to 60 degrees are preferably located on the three light emitting elements. In this case, the distance between the two light emitting elements located on the base side of the isosceles triangle is preferably one to two times the length of a side of the light emitting element located at the apex of the isosceles triangle. With this layout, both single-color light and mixed-color light can be more efficiently extracted from a light emitting device in which a plurality of light emitting elements of different emission colors are mounted.

The light emitting elements are housed in an opening of the package as discussed below. More specifically, the light emitting elements are mounted on the lead frame exposed on the opening bottom surface of the package using a bonding member. For example, in the case where the light emitting elements emit blue and green light and are formed by growing a nitride semiconductor on a sapphire substrate, an epoxy resin, a silicone resin, or the like can be used as the bonding member. When degradation due to heat and light from the light emitting elements is taken into account, the rear surfaces of the light emitting elements may be metal plated, or instead of using a resin for the joining member, a solder such as tin-bismuth based solder, tin-copper based solder, tin-silver based solder, or gold-tin based solder, a eutectic alloy such as an alloy whose main components are gold and tin, gold and silicon, gold and germanium, gold and copper, or silver and copper, a bump, an anisotropic conductor, a brazing material such as a low-melting point metal may be used for the joining member. Furthermore, in the case of using a light emitting element in which the electrodes are formed on both sides, such as an element that emits red light, bonding may be performed using a conductive paste made of silver, gold, palladium, or the like.

Package

The package includes a plurality of lead frames, and a resin molding that is formed integrally with these lead frames.

The size and shape of the package can be adjusted appropriately according to the size or shape of the desired light emitting device, the size of the light emitting elements being mounted, or the like. For example, the package is preferably formed in a prismatic shape (cuboid, rectangular parallelepiped, triangular prism, quadrangular prism, etc.), a circular column, an elliptical column, or in a shape that approximates one of these. It is especially preferable for the shape to be one that approximates a rectangular parallelepiped extending in the lengthwise direction.

Lead Frame

The lead frames each include a portion exposed at the bottom surface of the opening of the resin molding as discussed below, and the portion serve as the light emitting element mounting regions and/or the regions that are electrically connected to the light emitting elements. Furthermore, the lead frames each include another portion exposed on an outer surface of the resin molding and serves as region that function as a lead terminal.

The lead frames can have a substantially plate-like shape, they may have an undulating board shape or may be a board that has texturing. Since the light emitting device includes three light emitting elements, a plurality of lead frames are included in the light emitting device so that these light emitting elements can be individually driven. For example, four or five lead frames may be provided so that one or two lead frames are commonly connected with two or more of the three light emitting elements, and the other three lead frames can be connected individually with the three light emitting elements. Or, six lead frames may be provided so that the three light emitting elements can be connected to different lead frames. It is especially preferable for a single lead frame to be connected to just one electrode of a single light emitting element. Alternatively, the light emitting device may include one lead frame shared by the three light emitting elements and three or more lead frames separated from the one lead frame. With this configuration, the three light emitting elements can be individually driven with a simple structure. Also, a variety of wiring patterns, such as serial or parallel, can be selected for the mounting surface of the light emitting device, which allows appropriate circuit design. Furthermore, ensuring a heat dissipation path for each light emitting element allows heat generated from the light emitting elements to be dissipated uniformly, and thus allows for better heat dissipation.

There are no particular restrictions on the material of the lead frames, as long as it is capable of supplying the proper power to the light emitting elements. The lead frames are preferably formed from a material with relatively high thermal conductivity. Using a material such as this allows heat generated by the light emitting elements to be dissipated more efficiently. For example, preferable materials include those having a thermal conductivity of about 200 W/(m·K) or higher, those having relatively high mechanical strength, and those that are easy to punch, stamp, etch, etc. More specifically, examples of these materials include copper, aluminum, gold, silver, tungsten, iron, nickel, and other such metals, and iron-nickel alloys, phosphor bronze, and other such alloys. A surface of the lead frames is preferably plated with a light-reflective material in order to extract light more efficiently from the light emitting elements.

The size, thickness, and so forth of the lead frames can be suitably adjusted in view of the size, shape, and so forth of the light emitting device to be obtained. Since the lead frames are bent along the outer surfaces of the resin molding on the outside of the package, it is particularly preferable that burrs or the like of the lead flames are removed from the portions corresponding to the wall surfaces of the package or to the area near the package, and edges of the lead frames at these portions are preferably rounded off. This allows the lead terminals to be appropriately processed without impairing the shape of the package.

The shape and layout of the lead frames exposed at the bottom surface of the opening can be suitably set according to the type of light emitting element being used, the desired characteristics of the light emitting device, and so forth.

The lead frames exposed on the outer surface of the resin molding may be exposed on any surface of the resin molding, but preferably some of the lead frames protrude from the surface of the resin molding adjacent to the surface having the opening, and are bent toward the surface of the resin molding opposite to the surface having the opening. In the description below, the surface having opening may be referred to as "the front surface", the surface adjacent to the front surface and where the lead frame protrude may be referred to as "the lower surface", and the surface opposite to the front surface may be referred to as "the rear surface" The other lead frames may protrude from the lower surface and be bent toward the front surface side, or may be bent to the front surface side and bent toward the outer surfaces adjacent to the front surface and the lower surface (hereinafter may be referred to as "the side surfaces").

The lead frames may include one or more of those on which the light emitting elements are mounted, those on which the light emitting elements are mounted without being electrically connected to the light emitting elements, those that serve as heat dissipation members, those that serve as heat dissipation members without being electrically connected to the light emitting elements, those on which a protective element is mounted, and so forth. For example, one end of a lead frame may be exposed from a surface of the resin molding that is different from the surface where a portion of the lead frame is exposed (such as the surface opposite to the lower surface; hereinafter may be referred to as "the upper surface").

Resin Molding

The resin molding is formed integrally with the lead frames, houses and protects the light emitting elements, and also ensures insulation between light emitting elements and between the lead frames. As long as it has these functions, the resin molding may be formed from any material.

For instance, examples of resins that form the resin molding include thermosetting resins and thermoplastic resins. More specifically, examples include epoxy resin compositions, silicone resin compositions, modified epoxy resin compositions such as silicone-modified epoxy resins; modified silicone resin compositions such as epoxy-modified silicone resins; polyimide resin compositions and modified polyimide resin compositions; polyphthalamide (PPA); polycarbonate resins; polyphenylene sulfide (PPS); unsaturated polyesters and liquid crystal polymers (LCP); ABS resins; phenol resins; acrylic resins; and PBT resins.

These materials may contain a light reflective material, a light diffusing material, various dyes or pigments as a coloring agent, or other such additives. This can greatly reduce absorption of the emitted light by the package, and allows a package with high optical reflectivity to be obtained. Examples of light reflecting materials include titanium dioxide, silicon dioxide, zirconium dioxide, potassium titanate, alumina, aluminum nitride, magnesium oxide, boron nitride, mullite, niobium oxide, and various rare earth oxides (such as yttrium oxide and gadolinium oxide). Examples of light diffusing materials include calcium carbonate, aluminum oxide, barium sulfate, titanium dioxide, aluminum oxide, and silicon oxide. Examples of coloring agents include carbon black, chromium oxide, manganese dioxide, and iron oxide. Examples of other additives include glass fiber, wollastonite, and other such fibrous fillers, and carbon, silicon oxide, and other such inorganic fillers. These materials can be contained in an amount of 5 to 50 wt % with respect to total weight of the resin molding.

An opening for housing the light emitting elements is disposed on one surface of the resin molding. Although there are no particular restrictions on the size, shape, depth, and so forth of the opening, the opening preferably has, for example, a shape that extends in the lengthwise direction, such as an elliptical shape, a quadrangular shape, or a shape that approximates these when viewed from a side of the one surface of the resin molding. Also, inner walls of the opening preferably are inclined so as to widen from the bottom surface of the opening toward the one surface. This allows light emitted from the light emitting elements to be reflected by the inner walls of the resin molding, so that the light can be extracted more efficiently toward the front surface. However, in order to ensure adequate strength of the resin molding, or to improve adhesion to other members, etc., the walls of the resin molding that make up the opening may be textured by embossing, plasma processing, or the like, or the thickness of the walls may be partially or entirely unequal. Also, a portion of the outer surface of the resin molding may have a recess in order to house the lead frame or the like exposed on the outer surface.

Arrangement and Connection of Light Emitting Elements

One or two light emitting elements may be mounted on a single lead frame, but preferably three light emitting elements are mounted on a single lead frame.

In any arrangement of the lead frame, the three light emitting elements are preferably disposed so as to form an isosceles triangle with the bottom angle of 30 to 60 degrees in plan view. The isosceles triangle referred to here means a shape formed by straight lines that connect the centers or the centers of gravity of the light emitting elements. With this configuration, the three light emitting elements can be spaced closer together, so that color mixing can be easily adjusted, which allows color mixing performance to be enhanced. It is particularly preferable for the three light emitting elements mounted on a single lead frame to be disposed so as to form an isosceles triangle as mentioned above. Mounting three light emitting elements on the same lead frame facilitates extraction of mixed-color light due to light reflection at a surface of the lead frame located between the three light emitting elements.

Furthermore, in the case where the three light emitting elements are of different sizes, the centers or centers of gravity of the light emitting elements do not necessarily have to coincide with the three points that make up the isosceles triangle. The three light emitting elements should be disposed so that the three points that make up the isosceles triangle will overlap at least a portion of the light emitting elements.

In plan view, the two light emitting elements located on the base of the isosceles triangle out of the three light emitting elements are preferably disposed so as not to overlap with the other light emitting element in the lengthwise direction of the opening of the package and/or the resin molding. The phrase "not overlap in the lengthwise direction" means that in plan view, a straight line extending in the lengthwise direction does not pass through both of the one light emitting element located at the apex of the isosceles triangle and the two light emitting elements that make up the base of the isosceles triangle. Also, it is preferable for all three of the light emitting elements to be disposed so as not to overlap in the short-side direction that is perpendicular to the lengthwise direction. In view of the color mixing performance of the light emitting elements, it is preferable for the light emitting elements to be disposed so that they are not too far apart. More specifically, the distance between the two light emitting elements located on the base of the isosceles triangle is preferably one to two times the length of a side of the light emitting element located at the apex of the isosceles triangle. The distance between the light emitting elements refers to a space between two adjacent light emitting elements, and means, for example, the distance between the opposing side surfaces of two light emitting elements in the case where two light emitting elements are arranged so that their side surfaces oppose each other. With this arrangement, the three light emitting elements can be closely arranged, while absorption of the light emitted from the light emitting elements by other elements can be greatly reduced, so that light extraction efficiency of the light emitting device can be improved.

The base of the isosceles triangle is preferably disposed closer to one side extending in the lengthwise direction of the opening of the resin molding. It is particularly preferable for the base of the isosceles triangle to be disposed closer to an outer surface opposite to the outer surface where the lead frame serving as an external terminal is exposed. In other words, of the three light emitting elements, the two that make up the base of the isosceles triangle are preferably disposed closer to a surface opposite to the lower surface of the resin molding (hereinafter may be referred to as the upper surface).

The base of the isosceles triangle is preferably parallel or substantially parallel to one side of the opening of the resin molding. The term "substantially" means that inclination of about ±5° is allowed. In other words, the two light emitting elements that make up the base of the isosceles triangle are preferably arranged with the same distance from the above-mentioned one side of the opening of the resin molding.

With this arrangement, both single-color light and mixed-color light can be more efficiently extracted from the three light emitting elements by reflection from the inner walls of the opening.

In plan view, the light emitting element located at the apex of the isosceles triangle is preferably disposed on the center line perpendicular to the lengthwise direction. The center line here refers to a line that passes through the center of the opening in the lengthwise direction and is perpendicular to the lengthwise direction. In other words, this light emitting element is preferably arranged with the same distance from both ends of the opening in the lengthwise direction. This arrangement makes it possible for the light distribution characteristics to be more uniform with respect to lengthwise direction.

When the three light emitting elements are each substantially rectangular in plan view, then the three light emitting elements are preferably each disposed so that their side surfaces face to the side surface of the opening of the resin molding. With this arrangement, light can be reflected by the inner walls of the opening of the resin molding, so that light extraction efficiency of the light emitting device, particularly in the case of emitting single-color light, can be improved.

The light emitting elements and the lead frames are electrically connected by wires. In this case, each of the electrodes of one light emitting element is preferably connected to a lead frame with the wire. However, in the case of using a light emitting element with an upper electrode and a lower electrode, one of the pair of positive and negative electrodes may be connected. For example, in the light emitting elements that are often used in full-color light emitting devices in which three light emitting elements (red, blue, and green) are used, just one of the electrodes of the red light emitting element may be connected with the wire, and the pair of positive and negative electrodes of the green and blue light emitting elements may be connected with the wires.

The wire, for example, can be made of gold, silver, copper, platinum, aluminum, or another such metal or an alloy of these, and a surface of the wire can be covered with silver or a silver alloy. In particular, in the case of selecting a material with high reflectivity, it is preferable to use silver, copper, lead, aluminum, platinum, or an alloy of these, with silver and silver alloys being especially good. There are no particular restrictions on the diameter of the wire, but it can be in a range of about 10 to 70 µm, for example, preferably in a range of about 15 to 50 µm, and more preferably in a range of about 18 to 30 µm.

In addition to the light emitting elements, one or more protective elements may be disposed in the light emitting device. There are no particular restrictions on the protective element, and any known type that is mounted in light emitting devices may be used. More specifically, the protective element can be protective circuits for use against excessive heat, excessive voltage, or excessive current, antistatic protective elements, or the like. It is particularly preferable to provide a protective element corresponding to light emitting elements that emit green or blue light, and it is more preferable to provide a protective element corresponding to each of the light emitting elements that emit green or blue light. The protective element is preferably disposed at a location far away from the light emitting elements, that is, at a location where the absorption of light emitted from the light emitting elements can be greatly reduced. For example, as discussed above, in the case where the one light emitting element located at the apex of an isosceles triangle is disposed on the center line perpendicular to the lengthwise direction, disposing two protective elements at both ends of the opening allows the absorption of light by the protective elements to be greatly reduced, and thus allowing light to be extracted evenly.

In this light emitting device, the opening in which the light emitting elements are mounted is preferably filled with a light-transmissive covering material. This light-transmissive covering material can protect the light emitting elements from external force, moisture, and the like, and can also protect the wires. The light-transmissive covering material can be suitably selected from among the above-mentioned thermosetting resins and thermoplastic resins. The term light-transmissive described above means that at least 60% of the light emitted from the light emitting elements can be transmitted, and preferably at least 70% or 80%.

The light-transmissive covering material may contain the above-mentioned light diffusing materials, phosphors, etc. Any phosphor that is known in this field can be used. More specifically, examples include cerium-activated yttrium-aluminum-garnet (YAG), cerium-activated lutetium-aluminum-garnet (LAG), europium- and/or chromium-activated nitrogen-containing calcium aluminosilicate (CaO—$Al_2O_3$—$SiO_2$), europium-activated silicates ($(Sr, Ba)_2SiO_4$), and manganese-activated fluoride complex phosphors such as $A_2MF_6$:Mn (where A is one or more of Li, Na, K, Rb, Cs, and $NH_4$, and M is one or more of Ge, Si, Sn, Ti, and Zr), such as $K_2SiF_6$:Mn (KSF), KSNAF ($K_2Si_{1-x}NaAl_xF_6$:Mn), or $K_2TiF_6$:Mn (KTF). These may be used singly or in combinations of two or more.

The light emitting device pertaining to an embodiment of the present invention will now be described in detail through reference to the drawings.

Figure 2A:
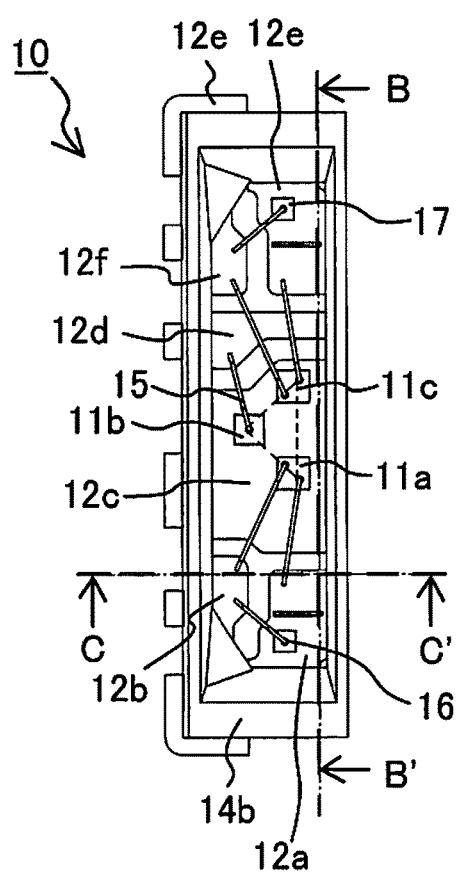
FIG. 2A is a schematic front view of the light emitting device in FIG. 1.
Figure 2B:
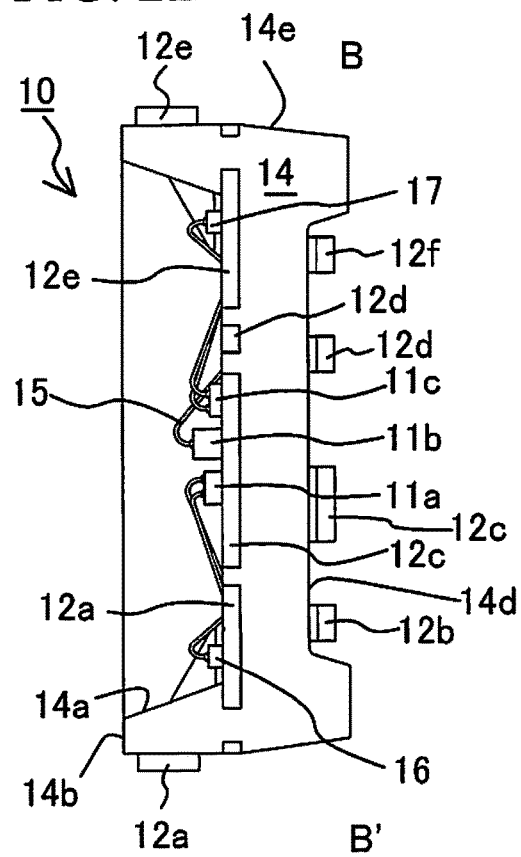
FIG. 2B is a schematic B-B' cross sectional view of FIG. 2A.
Figure 2C:
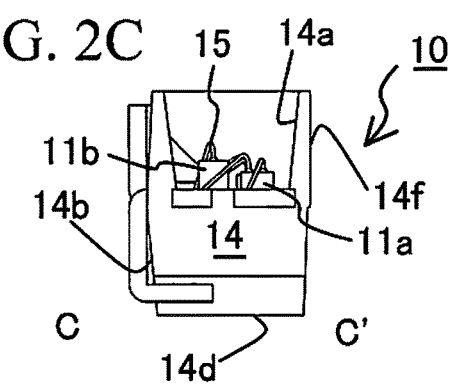
FIG. 2C is a schematic C-C' cross sectional view of FIG. 2A.
Figure 4:
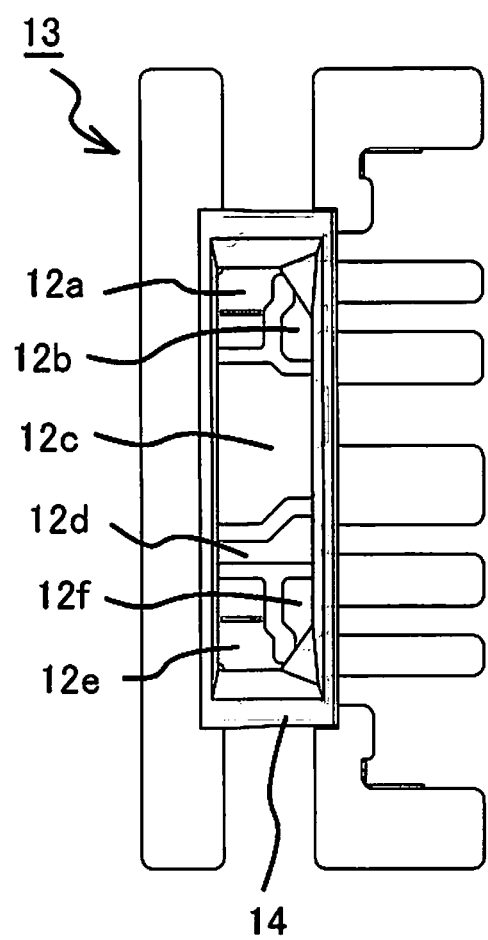
FIG. 4 is a schematic plan view of a package prior to the bending of a lead frame.

As shown in FIGS. 1 to 4, the light emitting device 10 in the present embodiment includes three light emitting elements corresponding to red, blue, and green (namely, a first light emitting element 11b, a second light emitting element 11c, and a third light emitting element 11a) and a package 13.

The package 13 includes a plurality of lead frames and a resin molding 14 that is formed integrally with these lead frames.

The resin molding 14 is substantially cuboid in shape, and one surface thereof (such as the front surface 14b) includes an opening 14a for housing the light emitting elements. The opening 14a has a shape that extends in the lengthwise direction, and with a length of 3.45×0.81 mm.

The lead frames are formed to have plate-like shape made of an alloy of ferrous copper, and their surfaces are plated with silver so that the light from the light emitting elements mounted thereon can be extracted more efficiently.

Of the plurality of lead frames, a portion of the second lead frame 12c is exposed at the bottom surface of the opening 14a, and the three light emitting elements 11a, 11b, and 11c are mounted on a surface of the exposed portion of the second lead frame 12c. Of the three light emitting elements, the first light emitting element 11b is a light emitting element with an upper electrode and a lower electrode, and the second lead frame 12c is electrically connected to one of the electrodes of the first light emitting element 11b. Of all the lead frames, the second lead frame 12c has the largest surface area of the surface that is exposed at the bottom surface of the opening 14a, and is disposed continuously from one end side to the other end side in the short-side direction of the opening 14a. Another portion of the second lead frame 12c, which is different from the surface of the portion that is exposed at the bottom surface of the opening 14a, is exposed on an outer surface of the resin molding 14, and is bent along the outer surface to create a portion that functions as an external connection terminal.

Fourth lead frames 12a and 12b are disposed at one end in the lengthwise direction of the bottom surface of the opening 14a, and are electrically connected by wires 15 to one of the electrodes of the third light emitting element 11a. The fourth lead frames 12a and 12b are also electrically connected to a protective element 16.

The first lead frame 12d is adjacent to the second lead frame 12c, and is exposed from one end to the other in the short-side direction of the bottom surface of the opening 14a. The first lead frame 12d is electrically connected by wires 15 to one of the electrodes of the first light emitting element 11b.

Third lead frames 12e and 12f are disposed adjacent to the first lead frame 12d, at the other end in the lengthwise direction of the bottom surface of the opening 14a. The third lead frames 12e and 12f are electrically connected by wires 15 to one of the electrodes of the light emitting element 11c. The third lead frames 12e and 12f are electrically connected to a protective element 17.

The first lead frame 12d is disposed between the third lead frames 12e and 12f that are connected to the light emitting element 11c with the wires and the second lead frame 12c on which the light emitting elements 11a, 11b, and 11c have been mounted. That is, the wire that connect the second lead frame 12e and the light emitting element 11c and the wire that connect the second lead frame 12f and the light emitting element 11c are arranged to straddle the first lead frame 12d. Accordingly, the first lead frame 12d is formed to have a shortest length in the lengthwise direction of the opening 14a among all the lead frames. This can greatly reduce a length of the wire 15 over the first lead frame 12d. Setting the wire length as short as possible effectively reduces breakage of the wire 15 resulted from expansion, etc., of the package 13 due to heat from the light emitting elements.

The lead frames each include a portion exposed on the outer surface of the resin molding 14 that are different from the portion exposed at the bottom surface of the opening 14a. More specifically, the portions exposed on the outer surface of the resin molding 14 protrude from the lower surface 14c and the side surface 14e. The fourth lead frame 12b, the second lead frame 12c, the first lead frame 12d, and the third lead frame 12f protruding from the lower surface 14c of the resin molding 14 are bent toward the rear surface 14d side of the resin molding 14 along the outer surface of the resin molding 14. The fourth lead frame 12a and the second lead frame 12e protrude from the lower surface 14c, are bent toward the front surface 14b side along the outer surface of the resin molding 14, and are also bent toward the side surface 14e.

The three light emitting elements 11a, 11b, and 11c are each rectangular in plan view. The first light emitting element 11b emits red light, and has a length of 210 μm along one side, for example. The second light emitting element 11c emits blue light, and has a length of 230 μm along one side, for example. The third light emitting element 11a emits green light, and has a length of 230 μm along one side, for example.

The three light emitting elements 11a, 11b, and 11c are disposed so as to form an isosceles triangle with a bottom angle of 45 degrees. The two light emitting elements located on the base of the isosceles triangle (the second light emitting element 11c and the third light emitting element 11a) are disposed without overlapping the first light emitting element 11b in the lengthwise direction of the opening 14a of the resin molding 14. Also, all three of the light emitting elements 11a, 11b, and 11c are disposed without overlapping in the short-side direction that is perpendicular to the lengthwise direction.

This arrangement allows the absorption of light emitted from the light emitting elements by the other light emitting elements to be greatly reduced, while disposing the three light emitting elements close together, and allows the light extraction efficiency to be improved in cooperation with a light reflection by the inner walls of the openings.

In plan view, the base of the isosceles triangle is disposed on the side extending in the lengthwise direction of the opening 14a of the resin molding 14, more specifically, disposed closer to the upper surface opposite to the outer surface where the lead frames are disposed. This base of the isosceles triangle is parallel to one side of the opening 14a of the resin molding 14. In other words, in plan view, the light emitting element 11c and the third light emitting element 11a that make up the base of the isosceles triangle have the same distance from one side of the opening 14a of the resin molding 14. For example, the distance from one side of the opening 14a to the center of the light emitting elements is about 220 μm. Also, the distance between the center of the light emitting element 11c and the center of the third light emitting element 11a is about 620 μm. Furthermore, in plan view, the first light emitting element 11b is disposed on the center line that is perpendicular to the lengthwise direction, and the distance from one side of the opening 14a of the resin molding 14 to the center of the first light emitting element 11b is about 540 μm.

Thus, in the light emitting device 10, the three light emitting elements are disposed so as to form an isosceles triangle whose length of the base is 620 μm and whose height is 320 μm. Also, the light emitting element 11c and the third light emitting element 11a are disposed 390 μm apart. This arrangement results in an increase in light extraction efficiency of the single-color light and mixed-color light emitted by the three light emitting elements.

The above-mentioned light emitting device 10 may be such that the opening 14a is filled with a light-transmissive covering material made of a light-transmissive resin such as a silicone resin.

INDUSTRIAL APPLICABILITY

The light emitting device of the embodiments of the present invention can be used in a variety of light sources, such as illumination light sources for gaming devices, light sources for display devices, light sources for ink curing for printing, light sources for resin curing, light sources for a light exposing device, a projector, light sources for a lighting, light sources for various kinds of indicators, a vehicle, a liquid crystal backlight, automotive parts, signaling devices, outdoor channel letters, and electric signboards.

What is claimed is:

1. A side-view type light emitting device comprising:
   first, second and third light emitting elements with different emission colors; and
   a package including
      a plurality of lead frames including a first lead frame, a second lead frame and a third lead frame to individually drive the first, second and third light emitting elements, and
      a resin molding formed integrally with the plurality of lead frames, the resin molding having an elongated shape with a dimension in a lengthwise direction being a longest dimension of the resin molding, and including a front surface, a rear surface opposite from the front surface, an upper surface extending between the front surface and the rear surface, a lower surface opposite from the upper surface and extending between the front surface and the rear surface, the front surface including a lower edge extending in the lengthwise direction and defining an interface between the front surface and the lower surface, the front surface including an upper edge opposite from the lower edge, the resin molding including an opening in the front surface to house the three light emitting elements,
   a portion of each of the plurality of lead frames being exposed on a bottom surface of the opening, and another portion of each of the plurality of lead frames being exposed at least on the lower surface of the resin molding,
   the first, second and third light emitting elements being disposed on the second lead frame exposed on the bottom surface of the opening and arranged so as to form an isosceles triangle with a bottom angle of 30 to 60 degrees, and a base of the isosceles triangle extending substantially parallel to the lower edge of the front surface with the base of the isosceles triangle being disposed closer to the upper edge than to the lower edge,
   a distance between the second light emitting element and the third light emitting element, which are located on the base of the isosceles triangle, is one to two times a length of a side of the first light emitting element, which is located at an apex of the isosceles triangle,
   the second light emitting element and the third light emitting element are disposed so as not to overlap the first light emitting element in the lengthwise direction,
   the first lead frame being connected to the first light emitting element by a first wire and spaced apart from the second lead frame,
   the third lead frame being connected to the second light emitting element by a second wire, and
   the first lead frame is disposed between the second lead frame and the third lead frame such that the second wire straddles the first lead frame.

2. The side-view type light emitting device according to claim 1, wherein
   the first, second and third light emitting elements are disposed without overlapping in a short-side direction of the resin molding, which is perpendicular to the lengthwise direction.

3. The side-view type light emitting device according to claim 1, wherein
   the base of the isosceles triangle is disposed closer to one side of the opening extending in the lengthwise direction of the opening in plan view.

4. The side-view type light emitting device according to claim 1, wherein
   the another portion of at least one lead frame of the plurality of lead frames is bent along the lower surface of the resin molding.

5. The side-view type light emitting device according to claim 1, wherein
   the first light emitting element is disposed on a center line of the opening perpendicular to the lengthwise direction in plan view.

6. The side-view type light emitting device according to claim 1, wherein
   the first, second and third light emitting elements emit red, blue, and green light, respectively.

7. The side-view type light emitting device according to claim 6, further comprising protective elements corresponding to the second and third light emitting elements that emit blue light and green light, respectively.

8. The side-view type light emitting device according to claim 1, wherein
   the first lead frame has a shortest length in the lengthwise direction among all the plurality of lead frames.

9. The side-view type light emitting device according to claim 1, wherein
   the bottom angle of the isosceles triangle is 45 degree.

10. The side-view type light emitting device according to claim 8, wherein the first light emitting element emits red light.

11. The side-view type light emitting device according to claim 10, wherein the second light emitting element emits blue light.

12. The side-view type light emitting device according to claim 8, wherein the base of the isosceles triangle is disposed between the upper surface and the apex of the isosceles triangle.

13. The side-view type light emitting device according to claim 1, wherein
   the lower surface of the resin molding constitutes a mounting surface of the side-view type light emitting device, and
   the second lead frame has the largest surface area among the plurality of lead frames on a lower surface side in the opening in plan view.

14. The side-view type light emitting device according to claim 1, wherein further comprising two protective elements respectively arranged at end portions in the opening such that the first, second and third light emitting elements are disposed between the two protective elements.

15. The side-view type light emitting device according to claim 1, wherein
each of the first and second wires extends from a corresponding one of the first and second light emitting elements generally toward the lower surface.

16. The side-view type light emitting device according to claim 1, wherein
the second lead frame extends continuously from one end side to the other end side of the opening in a short-side direction, which is perpendicular to the lengthwise direction.

17. The side-view type light emitting device according to claim 1, wherein
the second lead frame includes a light-reflective layer as an outermost layer.

18. The side-view type light emitting device according to claim 1, wherein
the bottom surface of the opening of the resin molding includes a lower edge and an upper edge extending in the lengthwise direction, with the lower edge of the bottom surface of the opening being shorter than the upper edge of the bottom surface of the opening, and
the bottom surface of the opening of the resin molding further includes a pair of oblique edges extending obliquely from both ends of the lower edge in plan view.

* * * * *